United States Patent [19]
Burns et al.

[11] Patent Number: 5,313,171
[45] Date of Patent: May 17, 1994

[54] HIGH SPEED, LOW DISTORTION AMPLIFIER DESIGN AND METHOD

[75] Inventors: Lawrence M. Burns, El Segundo; Robert Tso, South San Gabriel, both of Calif.

[73] Assignee: Hughes Aircraft Company, Los Angeles, Calif.

[21] Appl. No.: 973,500

[22] Filed: Nov. 9, 1992

[51] Int. Cl.$^5$ .............................................. H03F 3/45
[52] U.S. Cl. .................................... 330/252; 330/261
[58] Field of Search ............... 330/127, 149, 252, 261, 330/296

[56] References Cited

U.S. PATENT DOCUMENTS 4,709,216  11/1987  Davis ............................ 330/261 X
4,999,585  3/1991  Burt et al. ........................... 330/149

OTHER PUBLICATIONS

Grebene, Bipolar and MOS Analog Integrated Circuit Design, John Wiley & Sons, 1984, pp. 232–239.

*Primary Examiner*—Steven Mottola
*Attorney, Agent, or Firm*—Terje Gudmestad; W. K. Denson-Low

[57] ABSTRACT

A high speed, low distortion amplifier is implemented with all npn transistors by providing a correction circuit that responds to changes in the amplifier's input voltage by substantially reducing current variations in the input stage. This is accomplished with the use of a current source resistor for the second branch of the differential input stage, together with a correction circuit that diverts a portion of the resistor's current away from the input stage's second branch. The diverted current varies negatively with the input voltage, and thus compensates for input stage current variations that would result in the absence of the correction circuit. A differential amplifier with one branch biased in response to the input voltage and the other branch held at a constant bias is preferably used to establish the correction current. The invention is applicable to open loop amplifiers, fed forward closed loop amplifiers and bootstrapped closed loop amplifiers.

20 Claims, 4 Drawing Sheets

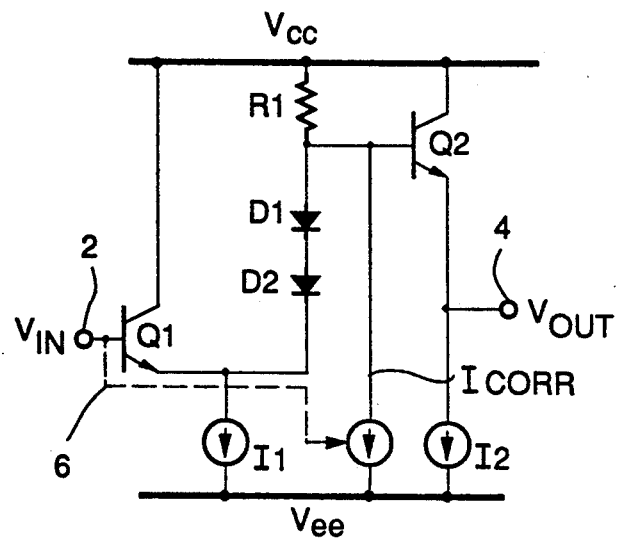
FIG. 3.
FIG. 4.
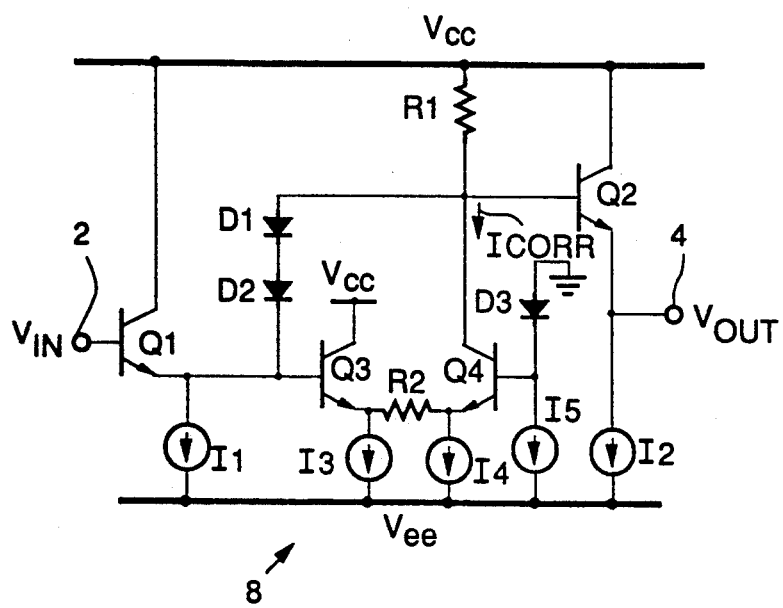

HIGH SPEED, LOW DISTORTION AMPLIFIER DESIGN AND METHOD

BACKGROUND OF THE INVENTION

1. Field of the Invention

This invention relates to electrical amplifier designs and methods, and more particularly to amplifiers that use npn bipolar transistors.

2. Description of the Related Art

The schematic diagram of a conventional open loop, unity gain active load amplifier circuit is given in FIG. 1. As explained below, it has low distortion but suffers from slow speed.

The amplifier includes a two-branch input stage, with an npn transistor Q1 in one branch and series connected diodes D1 and D2 in the other branch. The base of transistor Q1 is connected to an input terminal 2 that receives the amplifier's input voltage, while its collector is connected to a positive voltage bus Vcc and its emitter supplies current to an input stage current source I1; the current through the second branch diodes D1 and D2 also flows into I1.

An output stage, consisting of npn output transistor Q2 and an output current source I2 that draws current through the collector-emitter circuit of Q2, provides a voltage signal to an output terminal 4 that is taken from the emitter of Q2. The base of Q2 is biased by the diodes D1 and D2, with another constant current source I3 directing a constant current through the diode branch. The current through diodes D1 and D2 remains nearly constant as the input voltage Vin (and hence the output voltage Vout) vary. As a result, the current through Q1 is also nearly constant; these near constant currents for the input stage result in a highly linear relationship between Vout and Vin, and also produce a low distortion level. However, the transistor base-emitter voltage varies non-linearly with current, leading to distortion for any varying current.

Amplifier stages with active loads such as I3 are discussed in general in Grebene, *Bipolar and MOS Analog Integrated Circuit Design,* John Wiley & Sons, 1984, pages 232–239. The current source I3 is generally implemented as a pnp transistor. However, to include a pnp transistor in an npn integrated circuit (IC) process, the pnp device is currently implemented as a lateral transistor with high capacitance and is therefore slow, resulting in poor AC performance. This lack of speed limits the resolution of various circuits into which the amplifier can be incorporated. If a faster off-chip pnp transistor is used, the parasitic capacitance and inductance associated with its connection to the chip can significantly reduce its effective speed, in addition to the problem of not being able to include all of the circuit elements on a single chip. Non-monolithic designs are also more expensive and bulky, and less reliable.

The slow speed problems inherent in integrating a pnp current source into a npn amplifier circuit can be avoided by replacing the pnp device with a resistor R1, as illustrated in FIG. 2. This makes high speed operation possible, while simplifying the circuit by eliminating a current source. However, the resistor R1 allows the current through the diode branch to vary as the input voltage changes. As Vin rises, the voltage at the base of Q2 also rises. This reduces the current through R1 and increases the collector current of Q1 (since I1 is constant). This current variation introduces distortion and degrades the amplifier's linearity. The reduction in performance could at least theoretically be mitigated by increasing Vcc from a typical value of 5 volts to a substantially higher value such as 12 volts. This would reduce the effects of voltage variations across R1 due to changes in the input voltage, thereby making the current in the diode branch less sensitive to input voltage variations. But typical power supplies are limited to ±5 volts, and in any event increasing Vcc would have the undesired effect of raising the circuit's power consumption.

SUMMARY OF THE INVENTION

The present invention seeks to provide an all npn transistor amplifier that has high speed and high resolution, and yet has a high degree of linearity, large bandwidth and low distortion characteristics.

These goals are accomplished with the provision of a correction circuit that responds to changes in the input voltage to substantially reduce variations in the input stage current signal of an all npn transistor amplifier. The correction circuit is preferably implemented with a differential amplifier that has a first input connected to vary positively with the high speed amplifier's input voltage, and a second input that is biased so that the differential amplifier produces an output correction current signal that varies negatively with the input voltage. The correction current output is connected to subtract from the input stage's current signal, thereby holding the latter current nearly constant despite variations in the input voltage.

The current correction circuit allows for the use of a high speed current source resistor to furnish the input stage current. The current delivered from the current source resistor to the input stage is negatively supplemented by the correction current; the correction diverts a portion of the resistor current away from the input stage. Since the amount of diverted current varies negatively with the input voltage, both the input stage current and the voltage across the resistor current source are held substantially constant.

The invention is applicable to open loop, fed forward closed loop and bootstrapped closed loop amplifier configurations. With the open loop and fed forward closed loop designs, one transistor of an npn differential amplifier correction circuit is biased from the input voltage; with the closed loop bootstrapped design the differential amplifier is biased from the overall amplifier's output terminal.

The constant current source that results from the correction circuit gives a much higher open loop gain for the closed loop amplifier designs. This in turn results in a much lower distortion level when the gain is reduced by the addition of a feedback circuit, while retaining the high operating speed and resolution associated with the npn devices.

Further features and advantages of the invention will be apparent to those skilled in the art from the following detailed description, taken together with the accompanying drawings.

BRIEF DESCRIPTION OF THE DRAWINGS

FIG. 3 is a simplified schematic diagram illustrating the invention's principal of operation as applied to a high speed, unity gain, open loop amplifier;

FIG. 4 is a more detailed schematic diagram of the amplifier of FIG. 3 implemented in accordance with the invention.

DETAILED DESCRIPTION OF THE INVENTION

Figure 1:
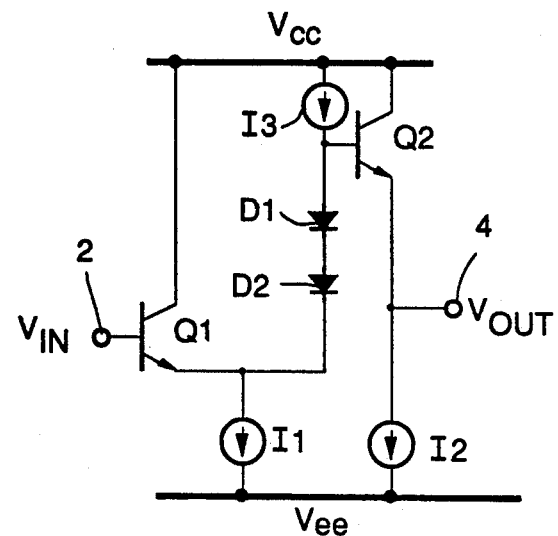
FIGS. 1 and 2 are schematic diagrams of prior amplifier designs, discussed above.
Figure 2:
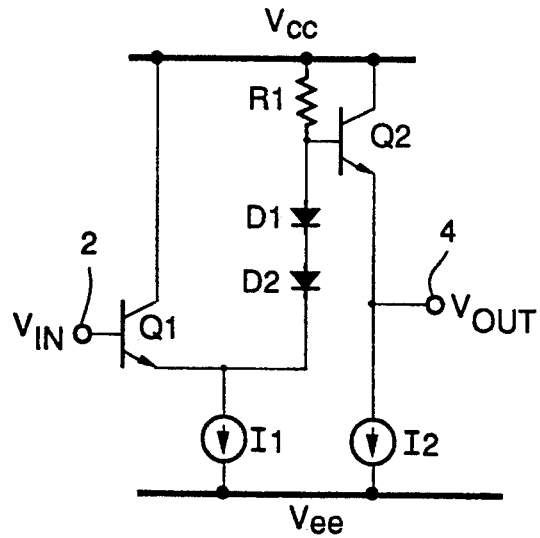

The basic concept of the invention, as applied to an open loop, unity gain amplifier such as in FIG. 1, is illustrated in FIG. 3; elements that are the same as in FIG. 1 are identified by the same reference numerals. The circuit is useful for numerous high speed applications, such as buffer or video amplifiers.

A voltage controlled current source $I_{CORR}$ draws a correction current from the junction of resistor R1 and diode D1. Current source $I_{CORR}$ is controlled in response to the amplifier's input voltage, and indicated by dashed line 6, so that the correction current drops when Vin increases and is raised when Vin goes down. This negative voltage-current relationship is set up so that the reduction in the correction current due to an increase in Vin balances the reduction in the current through R1 due to the increased voltage at the bottom of R1. (Since the voltage at the top of R1 is held constant at reference value Vcc, typically 5 volts, any increase in the voltage at the bottom of R1 is reflected as a reduction in the differential voltage across R1.) Correction current source $I_{CORR}$ diverts a portion of the R1 current away from D1 and D2. Accordingly, the reduction in $I_{CORR}$ as Vin increases adds to the current through D1 and D2. Conversely, when Vin goes down $I_{CORR}$ increases by an amount that balances the increase in the current through R1, and thus diverts more of the R1 current away from D1 and D2. The result in either case is that the current through D1 and D2, and also the collector current of Q1, are is held substantially constant, thus enhancing the circuit's linearity and reducing distortion.

A specific implementation for the correction current source is shown in FIG. 4. It consists of a differential amplifier 8 that includes a pair of npn bipolar transistors Q3 and Q4, current sources I3 and I4 drawing current respectively from the emitters of Q3 and Q4 to a negative voltage bus Vee, a correction resistor R2 connected between the emitters of Q3 and Q4, and a bias circuit for Q4 that has a diode D3 connected between a ground reference and the Q4 base, and a current source I5 drawing current from the cathode of D3 to Vee.

The current sources I1–I5 are preferably implemented with npn bipolar transistors having a common bias. The current magnitude supplied from the collector of each current source would generally be set by connecting a resistor with a desired resistance valve between the emitter of the current source transistor and Vee. In the circuit shown a suitable set of operating parameters is as follows:

| | |
|---|---|
| Vcc: +5 V | I1: 4 mA |
| Vee: −5.2 V | I2: 15 mA |
| R1: 1200 Ohms | I3: 1.3 mA |
| R2: 1200 Ohms | I4: 1.3 mA |
| Vin: ±0.724 V (peak-to-peak) | I5: 2 mA |

While a constant bias is applied to the base of Q4, the bias for Q3 is set up so that it varies along with Vin. This is accomplished by connecting the emitter of input transistor Q1 to the base of Q3; since the emitter voltage of Q1 tracks its base voltage Vin (as reduced by its base-emitter voltage drop), the base of emitter follower Q3 similarly tracks Vin. The collector of Q3 is connected to Vcc, while the collector of Q4 is connected to the opposite side of R1 from Vcc and thereby constitutes the output of the correction circuit that carries the correction current $I_{CORR}$.

In operation, an increase in Vin raises the voltage at the base of Q3. Current flow is accordingly shifted from Q4 to Q3, with a current flow through R2 in one direction or the other accounting, for any differences between the currents through Q3 and Q4 and their associated current sources I3 and I4. The shift of current from Q4 to Q3 means that the correction current $I_{CORR}$ has been reduced, and thus diverts less of the R1 current away from D1 and D2. This current shift in favor of D1 and D2 balances the shift in current from D1/D2 to Q1 that would otherwise take place as a result of the increase in Vin. The reduction in $I_{CORR}$ thus balances the increase in Vin, leaving the net current flow through D1 and D2 essentially constant. Since the currents through Q1 and through D1/D2 sum to the constant current of source I1, the Q1 current is thus also stabilized.

Numerous other circuits can be designed to provide the correction current $I_{CORR}$ envisioned by FIG. 3. For example, the r correction circuit network of FIG. 4 with a single resistor R2 between two current sources I3 and I4 can be replaced by a T network with a pair of resistors connected in series between the emitters of Q3 and Q4; a common current source would be connected between the resistor junction and Vee. The two resistors in the T network would each have half the resistance value of the single resistor R2 in the TT circuit, which the single current source would have twice the current magnitude of the current sources I3 and I4 in the TT network.

Figure 5:
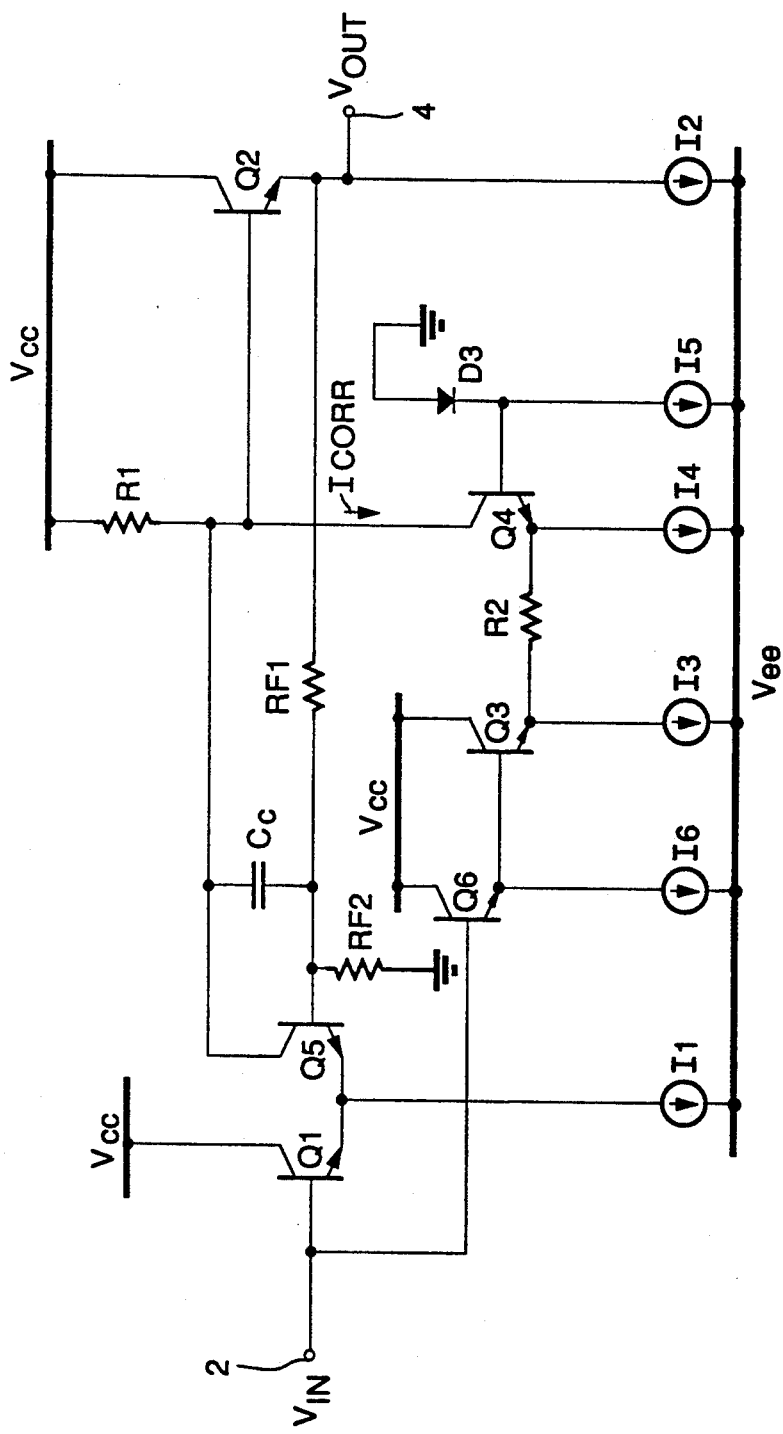
FIGS. 5 and 6 are schematic diagrams of closed loop amplifiers that incorporate the invention, showing fed forward and bootstrapped configurations, respectively.

The invention is also applicable to closed loop amplifiers. A high speed circuit of this type that uses a fed forward configuration to generate the correction current is shown in FIG. 5. Elements that are the same as in FIG. 4 are identified by the same reference numerals. Instead of the diodes D1 and D2, a second npn transistor Q5 is connected in the second branch of the input stage. A feedback circuit is provided, consisting of resistor RF1 between the output terminal 4 and the base of Q5, and resistor RF2 between the base of Q5 and a ground reference. The amplifier's gain is set in the conventional manner as equal to the sum of RF1 and RF2, divided by RF2. A conventional compensation capacitor Cc is connected between the collector and base of Q5 to provide an adequate phase margin that keeps the amplifier stable.

Rather than connecting the emitters of Q1 and Q5 directly to the base of Q3, the input terminal 2 is connected via the base-emitter circuit of an additional npn transistor Q6 to the base of Q3. This prevents the differential input stage from being cut off for a transient interval in the event of a very large step input signal. The collector of Q6 is connected to Vcc, and an additional current source I6 draws a current from its emitter. In this circuit I6 is preferably set at 0.7 mA, as is I5.

The stabilization of the Q1 and Q5 collector currents, despite variations of Vin, substantially increases the impedance seen at the collector of Q5. This in turn is reflected in a much greater open loop gain for the amplifier. The large value of open loop gain results in a much lower distortion level when the feedback circuit is added. Trading off gain to achieve high stability and greater bandwidth is a conventional technique; by providing a much greater initial open loop gain, the invention makes it possible to achieve a substantially greater stability and bandwidth for the same closed loop amplifier gain after feedback has been added.

Figure 6:
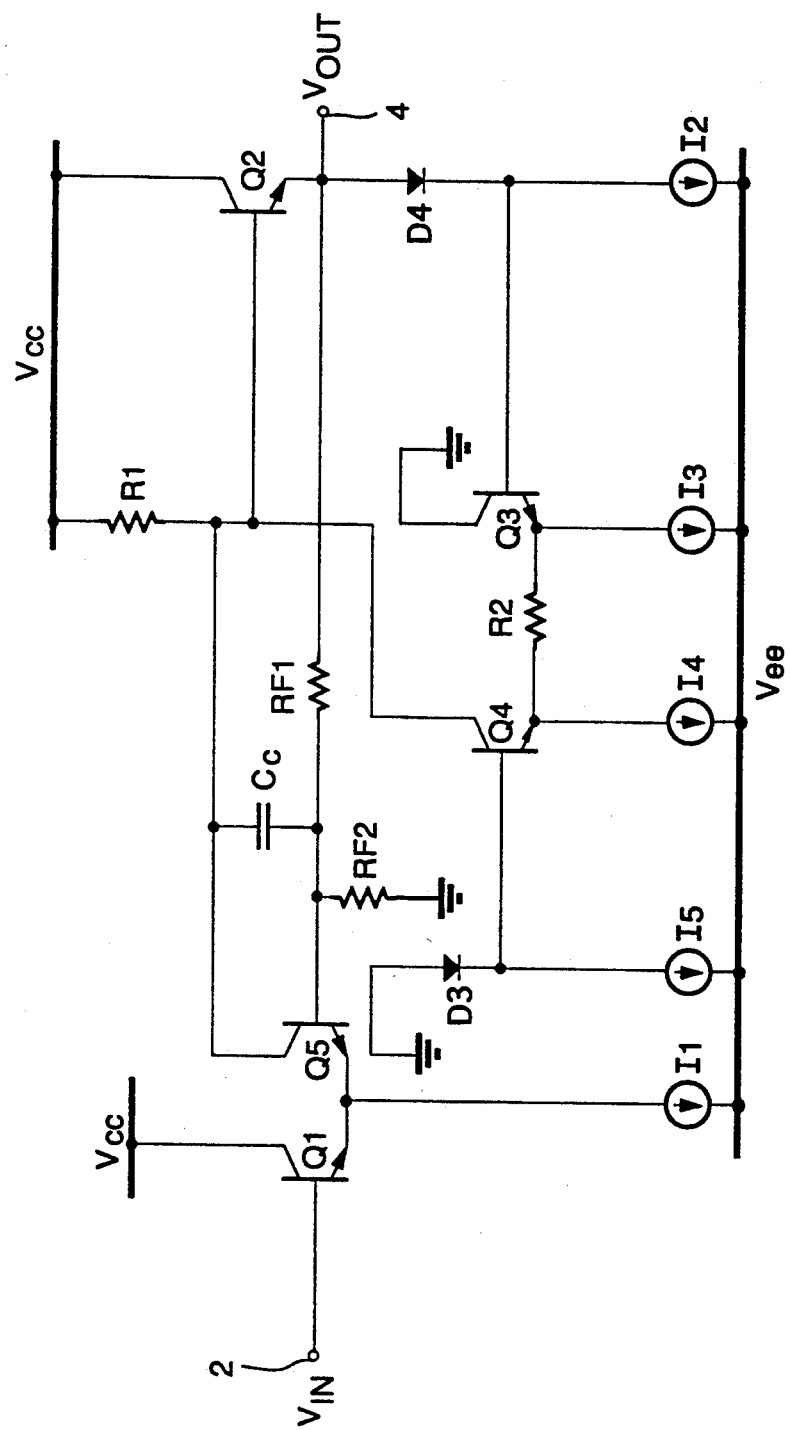

The application of the invention to a closed loop "bootstrapped" amplifier, which is slower but somewhat more linear than the closed loop fed forward amplifier just described, is illustrated in FIG. 6. The bootstrapped version has a higher open loop gain but a lower closed loop bandwidth. Again, elements that are the same as in prior figures are identified by the same reference numerals. In this circuit the bias for correction circuit transistor Q3 is taken not from the input terminal 2, but rather from the output terminal 4 via a diode D4. However, since the output voltage tracks the input voltage at an amplified level, the bias for Q3 also varies positively with the input voltage. As with the circuit of FIG. 5, low distortion and an even higher linearity are achieved.

While particular embodiments of the inventions have been shown and described, numerous variations and alternate embodiments will occur to those skilled in the art. Accordingly, it is intended that the invention be limited only in terms of the appended claims.

We claim:

1. A high speed, low distortion amplifier, comprising:
    a main amplifier stage that includes a resistive load and is connected to receive an input voltage and to produce an output voltage signal, said resistive load modulating the current through said main amplifier stage in response to changes in the input voltage and thus adding a DC nonlinearity to the main amplifier stage's voltage transfer function,
    an auxiliary amplifier stage that responds to said input voltage signal to produce a correction current that substantially matches said current modulation through the main amplifier stage during normal operation of the low distortion amplifier, and
    a connection circuit that connects said auxiliary amplifier stage to said resistive load so that said correction current substantially supplies said current modulation, thereby alleviating said DC nonlinearity in the main amplifier stage's voltage transfer function.

2. A high speed, low distortion amplifier, comprising:
    a first stage connected to receive an input voltage and to produce a first stage voltage signal that varies positively with said input voltage and a first stage current signal that varies negatively with said input voltage, said first stage current signal variation adding distortion to the amplifier,
    an output stage that responds to said first stage voltage signal to produce an output voltage signal, and
    a correction circuit that responds to changes in said input voltage to substantially reduce said variations in the first stage current signal, said correction circuit comprising a differential amplifier having first and second inputs and an output, said first input being connected to vary positively with said input voltage, and means providing a bias for said second input so that said differential amplifier output carries a correction current signal that varies negatively with said input voltage, said differential current output being connected for said correction current signal to subtract from said first stage current signal.

3. The amplifier of claim 2, said first stage comprising a two-branch differential stage having a first branch for receiving said input voltage and a second branch for conducting said first stage current signal, and further comprising an impedance connected in circuit with a voltage reference to provide said first stage current signal to said second branch, said differential amplifier output being connected to divert a correction current portion of the current flowing through said impedance away from said second branch.

4. The amplifier of claim 3, said high speed amplifier comprising a unity gain open loop amplifier with said impedance also connected to said output stage.

5. The amplifier of claim 4, the first branch of said first stage comprising a bipolar transistor having its base connected to receive said input voltage, its collector connected to a voltage reference and its emitter connected to provide said first input to said differential amplifier.

6. The amplifier of claim 3, said high speed amplifier comprising a fed forward closed loop amplifier with said impedance also connected to said output stage.

7. The amplifier of claim 6, wherein said first input to said differential amplifier is connected through the emitter-base circuit of a bipolar transistor to receive said input voltage.

8. The amplifier of claim 6, said first stage comprising a pair of differentially connected first and second branch bipolar transistors, and further comprising a feedback circuit that includes a first feedback resistance connected between an output terminal and the base of the first stage's second branch transistor, and a second feedback resistance connected between the base of the first stage's second branch transistor and a ground reference.

9. The amplifier of claim 3, said high speed amplifier comprising a closed loop bootstrapped amplifier with said impedance also connected to said output stage.

10. The amplifier of claim 9, wherein a high speed amplifier output terminal is connected to provide said bias for the first input of said correction circuit differential amplifier such that the voltage at said first differential amplifier input varies positively with the output terminal voltage, and thus also varies positively with the input voltage to said high speed amplifier.

11. The amplifier of claim 9, said first stage comprising a pair of differentially connected first and second branch bipolar transistors, and further comprising a feedback circuit that includes a first feedback resistance connected between an output terminal and the base of the first stage's second branch transistor, and a second feedback resistance connected between the base of the first stage's second branch transistor and a ground reference.

12. A high speed, low distortion amplifier implemented with all npn bipolar transistors, comprising:
    a differential first stage comprising a first branch that consists of an input npn transistor having its base connected to receive an input voltage, its collector connected in circuit with a positive voltage bus and its emitter connected to supply current to a first stage current source, and a second branch that is also connected to supply current to said first stage current source,
    a current source resistor connected between a positive voltage bus and the second branch of said differential first stage to supply current to said second branch, an output terminal, an output npn transistor having its collector connected in circuit with a positive voltage bus, its emitter connected in circuit with said output terminal, and its base connected in circuit with said current source resistor, and an npn bipolar transistor current correction circuit connected to divert a portion of the current through said current source resistor away from the second branch of said differential first stage, the amount of current diverted by said current correction circuit varying negatively with said input voltage so as to substantially reduce the variations in said second branch current as a function of the input voltage.

13. The amplifier of claim 12, said current correction circuit comprising a first npn bipolar transistor connected with a base bias that varies positively with said input voltage, and a second npn bipolar transistor having a substantially constant base bias, the emitters of said current correction circuit transistors being connected differentially and the collector of said second current correction transistor providing said correction current.

14. The amplifier of claim 13, said current correction circuit further comprising a current correction resistor connected between the emitters of said current correction transistors, and first and second constant current sources connected to the emitters of said first and second current correction transistors, respectively, whereby the current flow through said current correction resistor from said first to said second current correction transistors varies positively with said input voltage, causing the collector current of said second current correction transistor to vary negatively with said input voltage.

15. The amplifier of claim 13, said high speed amplifier comprising an open loop amplifier wherein the emitter of said input transistor is connected to the base of the first transistor in the current correction circuit, and the second branch of said differential first stage comprises a diode circuit that is oriented to conduct current from said current source resistor to said first stage current source.

16. The amplifier of claim 13, said high speed amplifier comprising a fed forward closed loop amplifier, wherein the second branch of said differential first stage comprises an npn transistor having its collector connected to said current source resistor and its emitter connected to the emitter of said first branch npn transistor, the base of said first branch npn transistor is connected through the base-emitter circuit of another npn transistor to the base of the first current correction npn transistor, and a feedback circuit is connected between the base of said output npn transistor, the base of the second branch npn transistor in the first stage, and a ground reference.

17. The amplifier of claim 13, said high speed amplifier comprising a closed loop bootstrapped amplifier, wherein the second branch of said differential first stage comprises an npn transistor having its collector connected to said current source resistor and its emitter connected to the emitter of said first branch npn transistor, the base of the first current correction npn transistor is connected to track the voltage at said output terminal, and a feedback circuit is connected between said output terminal, the base of the second branch npn transistor in the first stage, and a ground reference.

18. A method of reducing distortion in a high speed amplifier, the amplifier including:

a differential first stage comprising a first branch that consists of an input npn transistor having its base connected to receive an input voltage, its collector connected in circuit with a positive voltage bus and its emitter connected to supply current to a first stage current source, and a second branch that is also connected to supply current to said first stage current source, a current source resistor connected between a positive voltage bus and the second branch of said differential first stage to supply current to said branch, the voltage across said resistor varying negatively with said input voltage, and an output stage connected to produce an output in response to said input stage, said method comprising:

sensing said input voltage, and supplementing the current provided from said current source resistor to said second branch of the first stage by an amount that varies positively with said input voltage, to substantially reduce the variation in the second branch current that would otherwise result from variations in the voltage across said current source resistor as said input voltage varies.

19. The amount of claim 18, wherein the current supplied from said current source resistor to said second branch of the first stage is supplemented by diverting a portion of the current through said current source resistor away from said second branch of the first stage, and varying the amount of diverted current negatively with respect to variations in said input voltage.

20. The method of claim 19, wherein said diverted current is established as the second branch current of a two-branch differential amplifier, and the current through the first branch of said differential amplifier is controlled to vary positively with respect to said input voltage.

* * * * *